United States Patent
Aziz

(12) 
(10) Patent No.: US 6,480,984 B1
(45) Date of Patent: Nov. 12, 2002

(54) RATE (M/N) CODE ENCODER, DETECTOR, AND DECODER FOR CONTROL DATA

(75) Inventor: Pervez M. Aziz, Allentown, PA (US)

(73) Assignee: Agere Systems Inc., Miami Lakes, FL (US)

(*) Notice: Subject to any disclaimer, the term of this patent is extended or adjusted under 35 U.S.C. 154(b) by 0 days.

(21) Appl. No.: 09/338,104

(22) Filed: Jun. 23, 1999

(51) Int. Cl.[7] .................. H03M 13/41; G11B 20/14; G11B 20/18
(52) U.S. Cl. ................ 714/795; 341/59; 341/94; 360/48
(58) Field of Search .................. 714/795, 792, 714/789; 341/59, 94; 360/48, 77.05

(56) References Cited

U.S. PATENT DOCUMENTS

| | | | |
|---|---|---|---|
| 3,836,956 A | | 9/1974 | Cross ................. 340/146.1 |
| 5,243,605 A | * | 9/1993 | Lekmine et al. ........... 371/43 |
| 5,257,272 A | * | 10/1993 | Fredrickson ............... 371/43 |
| 5,341,386 A | * | 8/1994 | Shimoda et al. ........... 371/43 |
| 5,384,671 A | * | 1/1995 | Fisher ..................... 360/51 |
| 5,576,906 A | * | 11/1996 | Fisher et al. ........... 360/77.08 |
| 5,619,539 A | | 4/1997 | Coker et al. ............. 375/341 |
| 5,661,760 A | * | 8/1997 | Patapoutian et al. ...... 375/341 |
| 5,737,142 A | * | 4/1998 | Zook ..................... 360/49 |
| 5,909,331 A | * | 6/1999 | Behrens et al. ........... 360/51 |
| 5,949,358 A | * | 9/1999 | Volz et al. ............... 341/102 |
| 6,049,438 A | * | 4/2000 | Serrano et al. ............ 360/49 |
| 6,115,198 A | * | 9/2000 | Reed et al. ............... 360/46 |
| 6,201,652 B1 | * | 3/2001 | Rezzi et al. .............. 360/40 |
| 6,201,839 B1 | * | 3/2001 | Kavcic et al. ............ 375/341 |
| 6,212,661 B1 | * | 3/2001 | Rub et al. ............... 714/769 |

* cited by examiner

Primary Examiner—Stephen M. Baker
(74) Attorney, Agent, or Firm—Steve Mendelsohn; Ian M. Hughes

(57) ABSTRACT

A system for block encoding and block decoding of servo data with a rate (M/N) code, where M is an integer greater than 1 and N is an integer that is greater than M. Two codes are described for the encoding and decoding processes: a rate (2/6) code and a rate (2/8) code. In general, block encoding and block decoding maps between M servo data bits and N coded symbol bits. Such block encoding with a rate (M/N) code may be employed in a magnetic recording system for encoding servo data that is written to a servo data sector on a magnetic recording medium. Encoded servo data is read from the magnetic medium and block decoded. A forced maximum-likelihood, partial-response (PRML) detector is used to detect the N coded symbol bits from channel samples read from the magnetic medium. Block encoding provides greater coding gain for a detector when the characteristics of the block code are used to improve performance of the PRML detector that is used to detect the N coded symbol bits. Such PRML detector may employ a Viterbi algorithm (VA). State transition decisions over a block of N channel samples, or N clock cycles, form a path through a trellis of the VA, and the characteristics of the block code are used to force decisions for state transitions in the trellis. The PRML detector may force a decision for each state transition based on a priori knowledge of the known valid transitions defined by the rate (M/N) code symbol bits.

17 Claims, 12 Drawing Sheets

RATE (M/N) CODE ENCODER, DETECTOR, AND DECODER FOR CONTROL DATA

BACKGROUND OF THE INVENTION

1. Field of the Invention

The present invention relates to data encoding and data decoding employed in transmission systems, and, more particularly, to a servo block code for an encoder and a related trellis for a maximum-likelihood detector used in conjunction with a decoder.

2. Description of the Related Art

Many digital transmission systems commonly employ maximum-likelihood sequence detection to enhance detection of digital data represented by a sequence of symbols (each symbol made up of a group of bits). The symbol bits are transferred as a signal through a transmission (communication) channel in which noise is typically added to the transmitted signal. For example, magnetic recording systems first encode data into symbol bits that are recorded on a magnetic medium. Writing data to, storing data in, and reading data from the magnetic medium may be considered a transmission channel that has an associated frequency response. A signal may then be read from the magnetic medium as a sampled signal (i.e., a sequence of output samples) representing the stored data (stored symbol bits). Magnetic recording systems for disk drives read and detect data from tracks on the magnetic medium (disk). Each track comprises user ("read") data sectors as well as system dedicated control (e.g., "servo") data sectors embedded between read sectors. Servo data sectors store servo data that is a form of control data the recording system uses 1) to search for tracks (during seek mode) and 2) to position a read head over the track on the magnetic medium. Some magnetic recording systems of the prior art employ digital signal processing to detect the stored servo data, while others may employ analog techniques.

FIG. 1 shows servo processing of a magnetic recording system 100. A portion of the servo data is received by a servo data encoder 101 (shown as a 1/N encoder) that encodes the portion using a rate 1/N code that is described subsequently. The remaining, non-encoded portion and encoded portion of the servo data are further processed by the magnetic write head 102 and then recorded on the magnetic medium 110. A magnetic read head 103 reads the information from the magnetic recording medium 110 as an analog signal.

FIG. 2 shows a format for recording the servo data in the servo data sector of magnetic recording medium 110. Servo data may include a preamble 201 that is a sequence of bits from which timing and gain information is recovered. Timing and gain information allows the magnetic read head 103 to obtain gain and phase lock relative to the incoming analog signal provided from a track of the magnetic medium 110. Also shown in FIG. 2 is a burst demodulation field 204 that contains burst data. Burst data may be used by the magnetic read head 103 to detect whether the magnetic read head 103 is positioned directly over the center of a track.

The preamble 201 may be followed by an encoded servo address mark (SAM) 202, which in turn may be followed by encoded Gray data 203 for the servo sector. The SAM 202 comprises a predetermined bit pattern to identify the sector as containing servo data, and may be employed to reset a framing clock used by the magnetic read head 103 to read tracks/sectors from the magnetic recording medium 110. The Gray data 203 represents the track number and cylinder information of the magnetic recording medium, and may be used by the magnetic read head 103 to avoid errors when reading adjacent tracks during seek mode. The SAM 202 and Gray data 203 are usually the portions of the servo data that are encoded as sequences of symbol bits before being recorded on the magnetic recording medium 110.

Returning to FIG. 1, magnetic read head 103 may provide a sampled analog signal representing the recorded and encoded servo data as output channel samples. The term "output channel sample" indicates that the data has passed through a transmission channel (e.g., magnetic medium 110) that has a form of frequency response (possibly having memory). This type of transmission channel (possibly including a frequency response of a subsequent equalizer) may be termed a partial response channel. The signal representing the encoded servo data has an added noise component and added signal distortion caused by passing the signal through the channel's frequency response. To partially correct for variations in the channel's frequency response or for frequency response characteristics of the circuitry of magnetic read head 103, the output channel samples may be applied to equalizer 104. The equalized output channel samples are then applied to a partial-response, maximum-likelihood (PRML) detector 105.

The PRML detector 105 employs an algorithm, such as the Viterbi algorithm (VA), to detect the sequence of symbol bits representing, for example, the encoded SAM 202 and encoded Gray data 203 from the output channel samples. Servo data decoder 106 (shown as a 1/N decoder) receives the detected symbol sequence from PRML detector 105 and decodes the sequence of symbol bits to reconstruct the servo data. Also shown is the burst demodulator 107, which extracts the burst demodulation data from the equalized output channel samples provided by equalizer 104.

Both the SAM 202 and Gray data 203 are encoded by the servo data encoder 101 by mapping each input bit to N output symbol bits, giving a coding rate of (1/N). For example, the biphase code of the prior art maps a "1" to a "0011" sequence. Such biphase code has a rate (¼), and such biphase code is described in, for example, U.S. Pat. Ser. No. 5,661,760. As the coding rate (1/N) approaches unity, less redundancy, and so less format overhead, is introduced by the encoding process when recording the servo data.

The Viterbi algorithm (VA) employed by PRML detector 105 provides a maximum a posteriori estimate of a state sequence of a finite-state, discrete-time Markov process observed in noise. Given a received sequence of channel output samples of a signal corrupted with additive noise, the VA finds a sequence of symbol bits which is "closest" to the received sequence of channel output samples. For the VA, closest is relative to a predefined metric. As is known, in a communication channel with additive white gaussian noise (AWGN), the VA may be the optimal, maximum-likelihood sequence-detection algorithm. The VA forms a trellis corresponding to possible states (portion of received symbol bits in the sequence) for each received output channel symbol per unit increment in time (i.e., clock cycle). Transitions between states in the trellis are usually represented by a trellis diagram in which the number of bits (corresponding to output channel samples and detected symbol bits) for a state is equivalent to the memory of the partial response channel. Transitions are "weighted" according to the predefined metric, and Euclidean distance may be used as a metric for the trellis structure.

FIG. 3 shows an 8-state trellis employed for a partial response channel having a memory length of three (e.g., an EPR4 channel with response $1+D-D^2-D^3$). The left column

301 of 3-bit states d(n−3,j ), d(n−2,j),d(n−1,j) represents state symbol bits for the channel samples in the PRML detector 105 during a previous clock cycle, while the right column 302 of 3-bit states d(n −2,k), d(n −1,k), d(n,k) represents state symbol bits for the channel samples during the current clock cycle. For this notation, in "d(n−1,j)", the j is the state in the trellis at time (n−1) (i.e., one of the states of the left column 301) and in "d(n,k)", k is the state at time n i.e., (i.e., one of the states of the left column 302). The right column 302 includes the state symbol bit, d(n,k) that corresponds to the currently received output channel sample at time n.

Each line, termed a branch, connecting the states in the left and right columns 301 and 302 represents a transition from a previous state of the trellis (i.e., a state of the previous trellis phase) to a current state the trellis (i.e., a state of a current trellis phase). The branch is a portion of a possible path through the trellis, and may be included in more than one path. For example, a branch connects the state #0 ("000") in the left column 301 (the originating state) to state #0 ("000") in the right column 302. This branch represents a potential decision of the detector that not only identifies the current channel sample d(n,0) as being a "0" symbol, but also for the path representing the sequence of symbol bits received by the PRML detector 105 up to time n. A branch also connects the state #4 ("100") to state #0 ("000") and represents a potential decision for channel sample d(n,0) being a "0" symbol except that now the originating state is "100". Therefore, two paths branches from the previous state may pass through the present state "000".

Similarly, two branches pass through each of the other states in the current trellis phase. Any destination state k ending in a "0"represents d(n,k) being the "0" symbol for the path going through state k while any destination state k ending in a "1" represents d(n,k) equivalent to the "1" symbol for the path going through state k. In general, the different possible paths may be represented by a P-state trellis where $P=2^Q$, Q an integer equivalent to the state length (i.e., memory length of the partial response channel). An EPR4 channel has the response $1+D-D^2-D^3$ and has 3-bit states, requiring a $2^3=8$-state trellis. The EEPR4 channel has the response $1+2D-2D^3-D^4$ and has 4-bit states, requiring a $2^4=16$-state trellis.

The VA recursively performs three steps to detect a path through a trellis corresponding to the received sequence of symbol bits. First, branch metrics for the trellis are calculated for the current states; second, updates for each state metric (sm, which is defined below) are calculated for all states;

and, third, survivor paths are determined. The survivor path represents the sequence of symbol bits entering a given state which is closest, according to the Euclidean distance, to the received sequence of symbol bits in noise. The branch metric for a state transition is defined as the Euclidean distance between the received output channel sample (yr[n]) and the ideal channel output sample (yi[n]) corresponding to the transition. To compute the entire, or global, sequence most likely received, the VA recursively calculates and updates state metrics of all states to provide a minimum path metric over several state transitions.

For the VA described above, the branch metric bm (Euclidean distance) of a given transition is defined as the negative logarithm of the likelihood function with respect to the received noisy output channel sample yr[n] and the ideal output channel sample yr[n]. Therefore, the branch metric bm(j,k,n) for the transition from the jth state at time n−1 to the kth state at time n, for the exemplary VA algorithm, is given by equation (1):

$$bm(j,k,n)=-\ln f(yr[n]-yi[n]) \qquad (1)$$

where yi[*] is the ideal channel output sample corresponding to the transition from the jth state to the kth state, and f(*) is the probability density function of the Gaussian noise sequence.

For each state, an add-compare-select (ACS) operation determines the minimum state metric sm for the state based on the previously calculated state metrics of two originating states j and b as well as the branch metrics of the two branches of these states arriving at the current state k. The ACS operation thus determines the state metric sm of state k at time n and can be described by equation (2)

$$sm(k,n)=\min((sm(j,n-1)+bm(j,k,n)), (sm(b,n-1)+bm(b,k,n))) \qquad (2)$$

where j and b are the two possible originating states, sm(j,n−1) and sm(b,n−1) are the state metrics of the originating states at the previous time (n−1), bm(j,k,n) represents the branch metric of the branch connecting states j and k at time n, and bm(b,k,n) represents the branch metric of the branch connecting states b and k at time n.

The VA finds the maximum likelihood sequence by determining the sequence of symbol bits, or path, through the trellis that provides a minimum path metric. The path metric is simply the accumulated branch metrics of different branches encountered by the path through phases of the trellis as different possible paths are considered. The state metric of a given state is the path metric at some particular time if the path includes the given state at that particular time.

A prior art implementation of the ACS operation for a pair of paths (branches) (termed an ACS unit) is shown in FIG. 4. Adders 404 and 405 each provide the sum of the state metric of time n−1 and branch metric of time n for a different path (termed a path sum). The comparator 401 compares the path sums provided by adders 404 and 405 and provides an output signal indicating which path sum has a minimum value. Multiplexer (MUX) 402, based on the output signal of the comparator 401, selects as the state metric sm for the current clock cycle (time n) the path sum having the minimum value.

Each branch corresponds to one decision for a symbol d(n,k), which symbol is either a "0" for one branch and a "1" for the other branch. The decision for selecting one branch over the other branch also corresponds to the decision for the value of ideal output channel sample yi[n]. At time n, the ideal output channel sample is either yi[j,k,n] or yi[b,k,n], where yi[j,k,n] is the ideal output channel sample yi[n] going from state j to state k. The branch metrics are calculated as in equation (1) (i.e., bm(j,k,n)=(yr[n]−yi [j,k,n])² and bm(b,k,n)=(yr[n]−yi[b,k n])² where yr[n] is the received output channel sample at time n). MUX 403, also based on the output signal of the comparator 401, selects either a "0" or "1" (corresponding to the symbol value of a branch) as a tentative decision made for the current symbol d(n,k). Therefore, for each state, the comparator 401 selects the minimum state metric for the current clock cycle and also provides a tentative decision for the current data bit d(n,k) in a path memory for storage and shifting.

The operation of the detector (i.e., the transition between states of the trellis) is described with respect to FIGS. 3 and 4 for a single clock cycle. For several clock cycles, the trellis is extended by repeating the basic trellis shown in FIG. 3. Each state in a trellis phase has a corresponding ACS unit.

During each clock cycle, the combined ACS units for the corresponding states in the trellis phase shift $P=2^Q$ bits, (i.e., d(n,k), (k=0, ..., P−1), into the path memory. After some decision delay, the PRML detector 105 forms a final decision as to which one of possible paths through this memory has a minimum path metric, and so corresponds to the most likely sequence of received symbol bits.

SUMMARY OF THE INVENTION

The present invention relates to circuits and methods for a system that encodes, records, detects, and decodes control data stored on a medium. The control data is encoded and decoded based on a rate M/N code the maps between a block of M data bits of the control data and a block of N symbol bits. The block of N symbol bits form a symbol representing the block of control data, where M is an integer greater than 1 and N is an integer greater than M. The control data may be used for subsequently reading information from the medium after recording. In accordance with an embodiment of the present invention, encoding comprises mapping a block of M bits of a sequence of control data into a block of N symbol bits and storing the N symbol bits on the medium.

In accordance with an exemplary embodiment, a sequence of blocks of N symbol bits is generated from a sequence of channel samples read from a medium and representing information. For this further embodiment, successive portions of the sequence of channel samples are received as transitions between sequential states of a trellis, wherein the sequence of channel samples corresponds to the sequence of blocks of N symbol bits. A set of trellis phases and a set of forcing phases are synchronized to the sequential states, the set of trellis phases corresponding to a block of N channel samples. A path through states of the set of trellis phases is determined in accordance with a maximum-likelihood detection algorithm. The path of states corresponds to a received block of N symbol bits, and wherein, for each trellis phase, a corresponding forcing phase provides, if necessary, a forced decision to the maximum-likelihood detection algorithm for a transition between states in the trellis, the forced decision based on a constraint of the rate (M/N) code.

In accordance with another exemplary embodiment, a sequence of symbol bits is generated from a sequence of channel samples read from a medium, the symbol bits representing a sequence of control data to be used for subsequently reading information from the medium. Blocks of N symbol bits are received, with each block of N symbol bits formed based on a rate (M/N) code applied to a block of M bits of control data. Each block of N symbol bits is mapped into a block of M bits based on the rate (M/N) code to generate the sequence of control data.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with exemplary embodiments of the present invention, servo data is block encoded with a rate (M/N) code, where M is an integer greater than 1 and N is an integer greater than M. In the described embodiments, servo data is block encoded or block decoded (i.e., the code is a mapping between M bits and a group of N symbol bits. For the preferred embodiments described herein, two codes are described for the encoding and decoding processes: a rate (2/6) code and a rate (2/8) code. Encoding in accordance with the present invention may provide greater coding gain for a detector due to the characteristics of block encoding with the rate (M/N) code. In accordance with some exemplary embodiments of the present invention, a forced, maximum-likelihood, partial-response (PRML) detector, such as a detector employing the Viterbi algorithm, may employ the characteristics of the block code to force decisions for detected encoded servo data values. The forced PRML detector may force a decision for each state transition between states corresponding to output channel samples received from a transmission channel, the output channel samples representing servo data encoded in accordance with the rate M/N code of the present invention.

The exemplary embodiments of the present invention are described herein as employed in a magnetic recording system for encoding and decoding servo data of a servo data sector. As would be apparent to one skilled in the art, the techniques as described herein may be extended to encoding and decoding in other types of data transmission systems in which PRML detectors are used, such as optical recording systems. In addition, the present invention may in general be extended to encoding and decoding processes employing codes of differing rates, and so the present invention is not limited to the two codes described herein.

Figure 1:
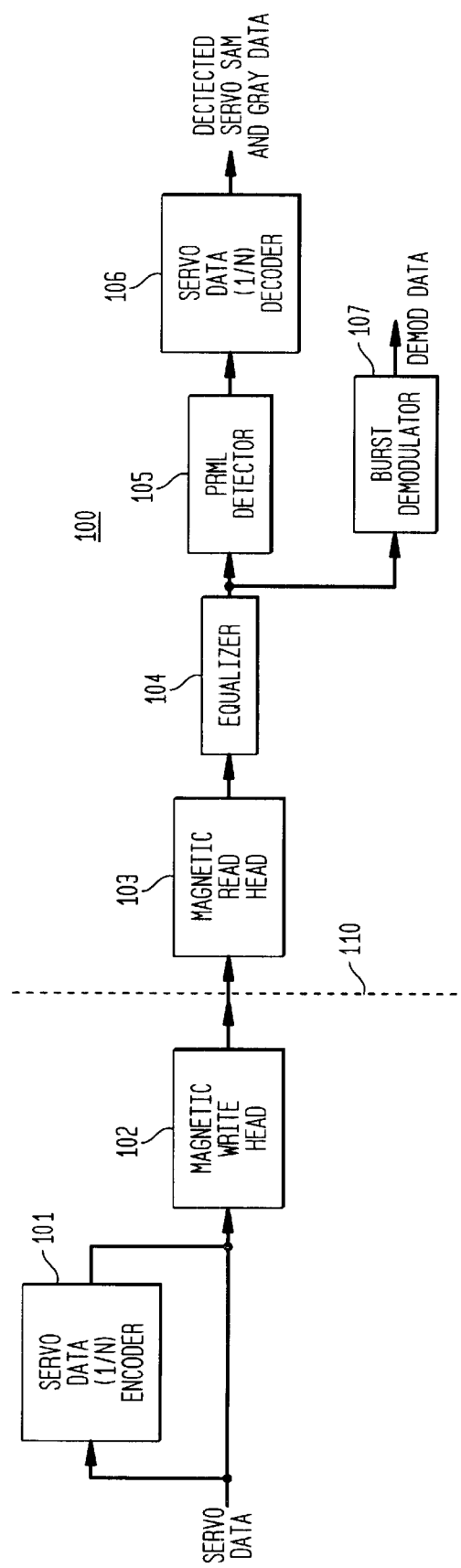
FIG. 1 shows servo processing of a magnetic recording system of the prior art.
Figure 2:
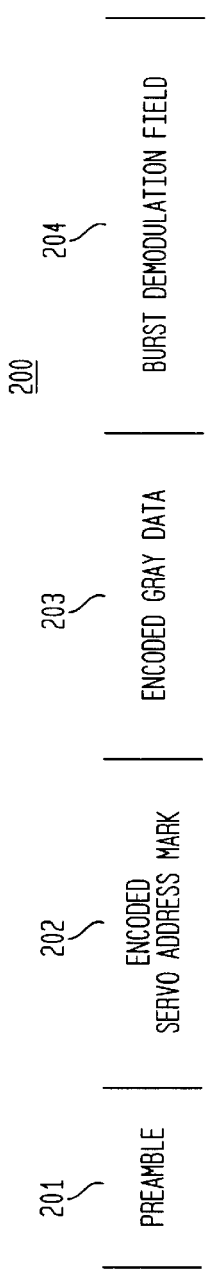
FIG. 2 shows a format for servo data recorded in the servo data sector of a magnetic recording medium for the system of FIG. 1.
Figure 3:
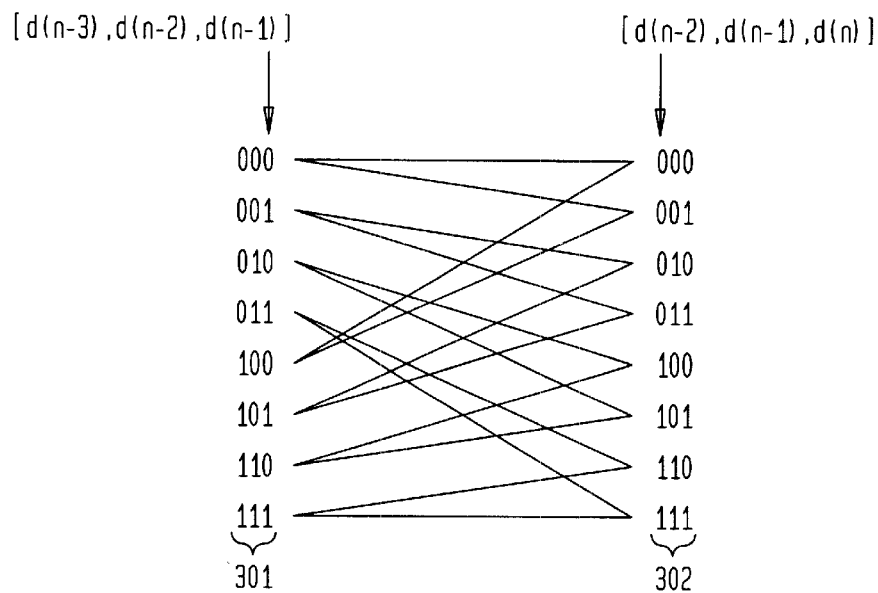
FIG. 3 shows an 8-state trellis of a Viterbi algorithm and employed by a PRML detector for a partial response channel having a memory length of three.
Figure 4:
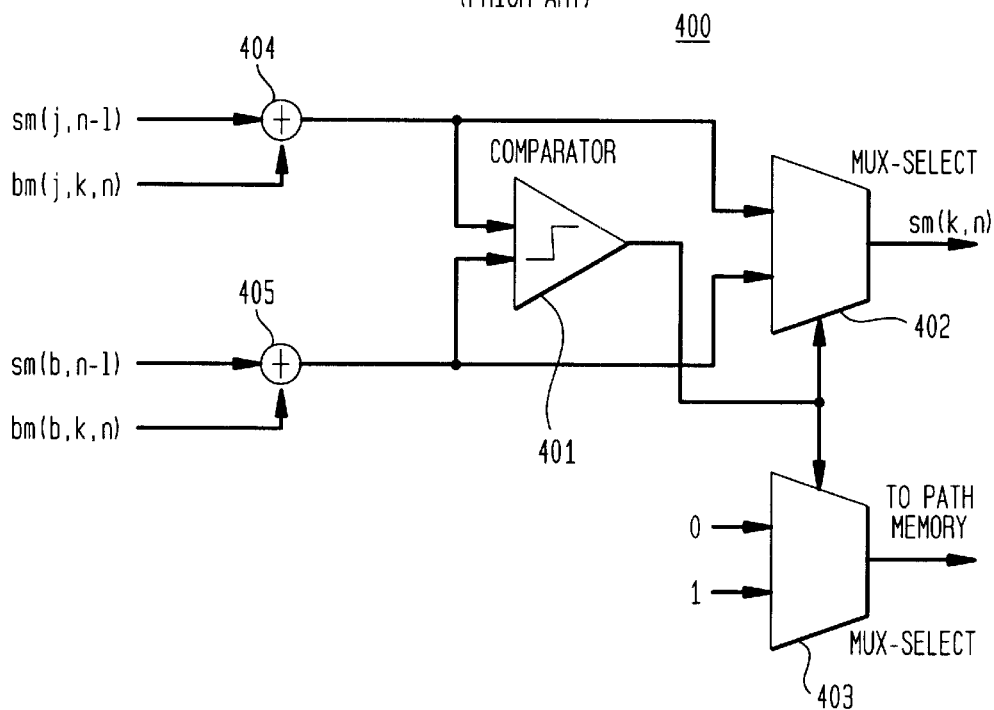
FIG. 4 shows a prior art implementation of an add-compare-select operation of the Viterbi algorithm of FIG. 3 for a pair of paths in a trellis.
Figure 5:
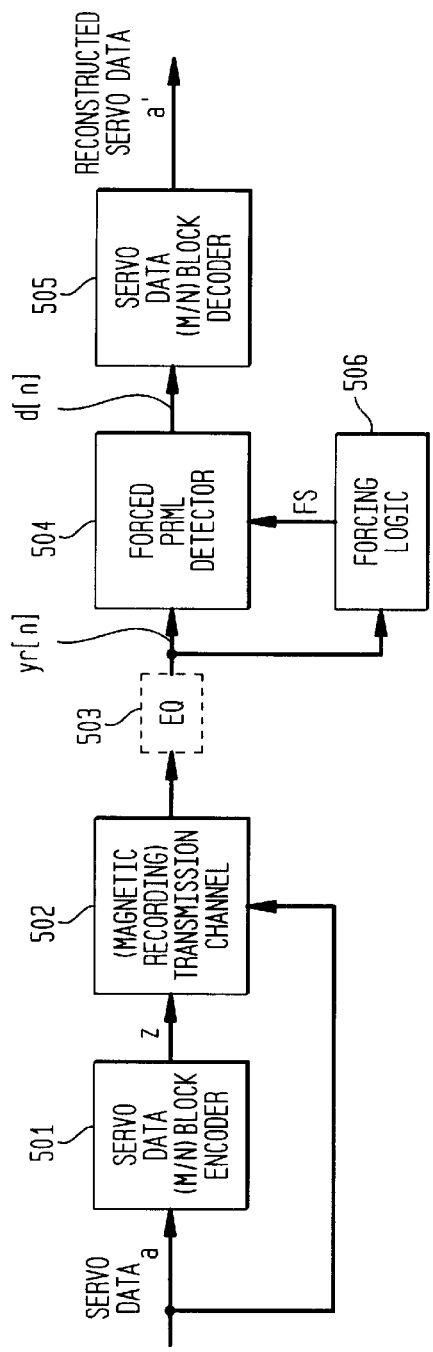
FIG. 5 shows an exemplary servo data recording system in accordance with the present invention.

FIG. 5 shows an exemplary servo data recording system 500 in accordance with the present invention. Servo data recording system 500 comprises a servo data block encoder 501, optional equalizer 503, forced PRML detector 504, forcing logic 506, and servo data block decoder 505. Encoded servo data is generally passed through a transmission channel 502 with encoded user data, system timing and gain information, and other peripheral information used by the system 500.

Transmission channel 502 includes a medium, such as magnetic medium or optical disk, that information is recorded on. Servo data recording system 500 receives control data that is employed by the system 500 to enable the system 500 to read information from the medium. The control data is also stored on the medium of the transmission channel 502. For the exemplary embodiments described herein, the control data is servo data employed by the servo of a magnetic read head to seek and locate tracks/sectors and position the servo over tracks/sectors on the medium. As would be apparent to one skilled in the art, the present invention is not so limited to servo data of magnetic recording systems, but may be employed for control data of other systems. Such systems may be optical systems that employ control data to control analogous functions of the laser-based read operation of the optical disk.

Servo data recording system 500 receives a sequence of servo datawords that include servo data that is to be encoded and may include servo data that is recorded directly on the magnetic medium. Servo data block encoder 501 (shown as a (M/N) block encoder) receives a sequence of datawords a that are to be encoded, each dataword a being of length M. The sequence of datawords represents the servo data to be encoded (e.g., Servo Address Mark (SAM) and Gray data). Servo data block encoder 501 applies a rate (M/N) block code to each dataword a to form a corresponding codeword z of length N. This block encoding process forms blocks of symbol bits defined by block boundaries. The sequence of codewords z is then transmitted as a signal through transmission channel 502, such as a magnetic recording channel or an optical recording channel. The transmission channel 502 and equalizer 503 have a partial (frequency) response with memory, and may be, for example, an EPR4 or EEPR4 channel of a magnetic recording medium. In addition to the characteristics of the recording medium, transmission channel 502 may also represent the combined frequency characteristics of the precoding, write and read head transfer functions, signal equalization, and filtering processes that are applied to the analog signal representing the sequence of codewords z.

After passing through the transmission channel 502, the signal representing the sequence of transmitted codewords z is then read from the transmission channel 502 and provided as a sequence of output channel samples. The sequence of output channel samples may be equalized by the optional equalizer 503 to provide the samples yr. Optional equalizer 503 corrects for variations in the characteristics of the recording channel or other device frequency characteristics specific to the implementation of system 500 that the signal passes through.

The sequence of equalized output channel samples yr is applied to a forced, partial-response-maximum likelihood (PRML) detector 504 that detects each codeword z from the sequence of output channel samples yr. Forced PRML detector 504 may employ a Viterbi algorithm (VA). Forcing logic 506 also receives the sequence of output channel samples yr; detects a beginning of the encoded servo data; synchronizes the VA to the block encoding process; and generates a forcing signal FS. Forcing signal FS is generated based on the constraints of the rate (M/N) code and the trellis phase of the VA synchronized to the block encoding process. Forced PRML detector 504 may employ the forcing signal FS to force decisions for symbol bits of codeword z corresponding to the current detected output channel sample by, for example, pruning the trellis of the VA employed by the forced PRML detector 504. The method of pruning of the VA the trellis is described subsequently.

Rate (M/N) Code

An encoder, such as servo data block encoder 501 of FIG. 5, maps an input dataword a to an output codeword z. Defining the input dataword a of M bits as elements $a(1)$, $a(2), \ldots, a(M)$, a set of logic equations may be derived that map the input dataword a to an output codeword z of N symbol bits defined as elements $z(1), z(2), \ldots, z(N)$. For example, the rate (2/6) code maps from a="00" to z="000111", a="11" to z="111000", a="01" to z="110011" and a="10" to z="001100". This mapping may be implemented with registers and combinational logic circuits that operate in accordance with the logic equations. Table 1 provides logic equations for exemplary mappings that may be implemented for the rate (2/6) code and rate (2/8) code, where a "!" represents a logical complement operation.

TABLE 1

| Rate (2/6) Code | | Rate (2/8) Code | |
|---|---|---|---|
| Encoder Equations | Decoder Equations | Encoder Equations | Decoder Equations |
| z(1) = a(2) | x(1) = z(3) | z(1) = a(1) | x(1) = z(1) |
| z(2) = a(2) | x(2) = z(1) | z(2) = a(1) | x(2) = z(5) |
| z(3) = a(1) | | z(3) = !a(1) | |
| z(4) = !a(2) | | z(4) = !a(1) | |
| z(5) = !a(1) | | z(5) = a(2) | |
| z(6) = !a(1) | | z(6) = a(2) | |
| | | z(7) = !a(2) | |
| | | z(8) = !a(2) | |

Figure 6B:
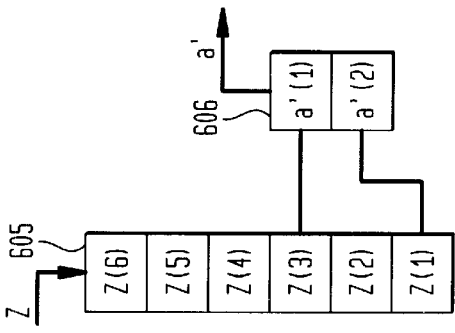
FIG. 6b shows an exemplary implementation of a decoding circuit for the servo data block decoder of FIG. 5 that employs a rate (2/6) code.
Figure 6A:
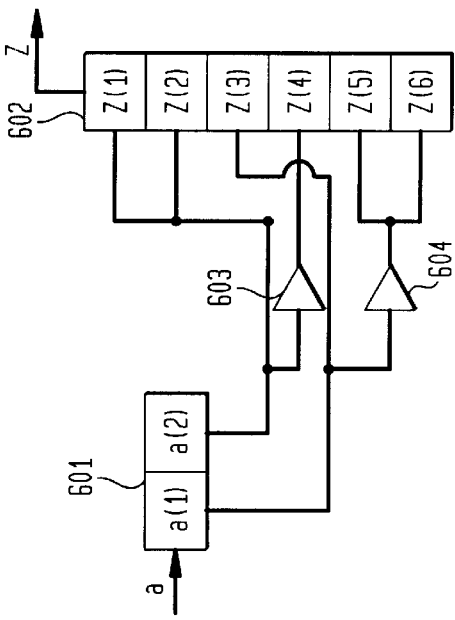
FIG. 6a shows an exemplary implementation of an encoding circuit for the servo data block encoder of FIG. 5 that employs a rate (2/6) code.

An encoding circuit as shown in FIG. 6a may be employed to implement the encoding logic equations given in Table 1 for the rate (2/6) code. Elements a(1) and a(2) of the dataword a are received serially by a 2-bit register 601. The elements a(1) and a(2) may be provided in parallel from 2-bit register 601 in accordance with a dataword clock. The complements of a(1) and a(2) are provided from inverters 604 and 603, respectively. The elements a(1), !a(1), a(2) and !a(2) are provided in parallel to corresponding stages of 6-bit register 602. The contents of 6-bit register 602 correspond to the elements z(1), z(2), z(3), z(4), z(5), and z(6). Elements z(1), z(2), z(3), z(4), z(5), and z(6) may be serially provided from 6-bit register 602 in accordance with a codeword clock to provide the output codeword z.

A decoder, such as the servo data block decoder 505 of FIG. 5, maps elements of the codeword z to elements of a decoded dataword x having elements x(1) through x(M). The elements of x desirably correspond to the elements of a, but may contain errors introduced by, for example, noise in a transmission channel. In a similar manner to the encoder, a set of logic equations may be employed to represent this mapping by the decoder. For the exemplary rate (2/6) rate code, the elements z(1) through z(6) of codeword z map logically to elements x(1) and x(2) of decoded dataword x as given in Table 1 above. A decoding circuit as shown in FIG. 6b may be employed to implement the decoding logic equations given in Table 1 for the rate (2/6) code. The decoding circuit includes a 6-bit register 605 and 2-bit register 606. The input codeword z is received serially into 6-bit register 605 in accordance with a codeword clock and selected elements loaded in parallel into corresponding stages of 2-bit register 606. The contents of 2-bit register 606 are provided serially in accordance with a dataword clock as elements x(1) and x(2) (corresponding to the elements a(1) and a(2)). Since the decoded dataword elements x(1) and x(2) are duplicated among the elements of codeword z, for some embodiments additional circuitry (not shown) may implement a "voting" method prevent selecting elements of z that have bit-errors as elements x(1) and x(2).

Also shown in Table 1 are the logic equations for encoding and decoding in accordance with the rate (2/8) code. The rate (2/8) code maps input datawords a of "00", "11", "01", and "10" to output codewords z of "00110011", "11001100", "00111100", and "11000011", respectively. The rate (2/8) code mapping may be implemented with an encoding circuit and a decoding circuit analogous to those shown in FIGS. 6a and 6b.

For an encoder, the mapping of the dataword a to codeword z is not unique and, as would be evident to one skilled in the art, may be rearranged to achieve a different mapping having a different performance (as measured by, for example, coding gain). For example, the rate (2/6) code could map a="00" to z="110011" instead of z="000111". Similarly, for a decoder, the mapping from the codeword z to decoded dataword x is not unique. For a decoder in accordance with the exemplary rate (2/6) code, the element x(1) may also be obtained as x(1)=! z(5) or x(1)=! z(6). Similarly, element x(2) may also be obtained as x(2)=z(2) or x(2)=!z(4). As with the rate (2/6) code, the logic equations for the rate (2/8) code encoder and decoder are not unique.

PRML Detection and Forcing Trellis Decisions

For the exemplary embodiments of the present invention, the servo data block encoder 501 encodes and servo data block decoder 505 decodes in accordance with a rate (2/6) code or a rate (2/8) code. In general, the rate (M/N) code is a constrained code because not all possible bit/symbol patterns occur or are defined, and specific bit/symbol patterns arise across block boundaries. In FIG. 5, the encoded servo data (SAM and Gray data) are detected by means of a forced, partial-response, maximum-likelihood (PRML) detector 505 that may implement steps of a program that employs a Viterbi algorithm (VA). The forced PRML detector 505 may typically be implemented with a processor, memory, and a plurality of Add-Compare-Select circuits. The processor of the forced PRML detector 505 may use knowledge of constraints imposed by the rate (M/N) block code process to reduce the probability of false detection. The probability of false detection refers to the actual or final decision of a state of a current trellis phase of the VA not corresponding to the actual value represented by the current output channel sample yr[n].

For a constrained code, the trellis employed in the forced PRML detector 504 is pruned by forcing the VA to select only certain branches in the trellis. The process of forcing uses constraints imposed by the block code to select branches corresponding only to valid state transitions. In general, for a code of block size B, the set of valid transitions constrained by the code will be different in the trellis over B clock cycles, corresponding to B forcing phases, and then the set repeats every B clock cycles.

Figure 7:
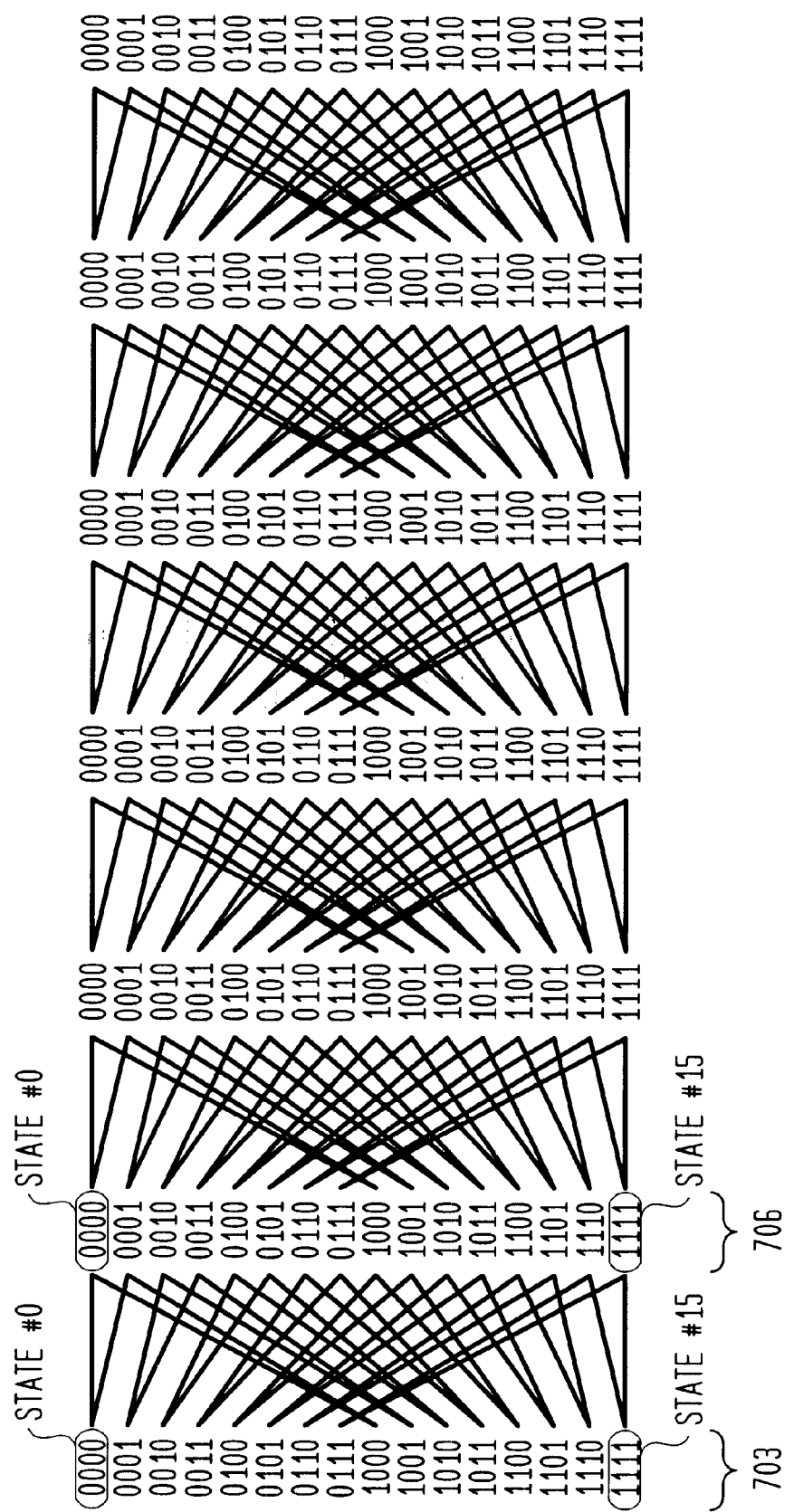
FIG. 7 shows a 16-state trellis used with the Viterbi algorithm for an exemplary rate (2/6) code of the present invention passing through a partial response channel having a memory length of four.

FIG. 7 shows a 16-state trellis of the VA for the rate (2/6) code of Table 1. The 16-state trellis may be employed when output channel samples provided to the forced PRML detector 504 (FIG. 5) are read from a magnetic medium that has an EEPR4 channel response. In FIG. 7, the initial input to the detector are decisions d(n−4), d(n−3), d(n−2), d(n−1) related to the values of the four channel samples yr[n−4] through yr[n−1]). At time n−1 (i.e., the previous clock cycle) the corresponding state in column 703 of the trellis is one of 16 possible states: state #0 ("0000"), corresponding to d(n−4)=0, d(n−3)=0, d(n−2)=0, d(n−1)=0, through state #15 ("1111"), corresponding to d(n−4)=1, d(n−3)=1, d(n−2)=1, d(n−1)=1. If the trellis phases are synchronized to the block encoding that is described subsequently, then yr[n−4] through yr[n−1] correspond to the last four symbol bits of the previous block of symbol bits.

At time n a new output channel sample yr[n] is added and the next state in column 706 of the trellis is again one of 16 possible states (state #0 ("0000"), corresponding to d(n−3)=0, d(n−2)=0, d(n−1)=0, d(n)=0, through state #15 ("1111"), corresponding to d(n−3)=1, d(n−2)=1, d(n−1)=1), d(n)=1). The new output channel sample yr[n] corresponds to the first symbol bit of the current block to be decoded. The next state in column 706 corresponds to the first phase of the current trellis.

Figure 8:
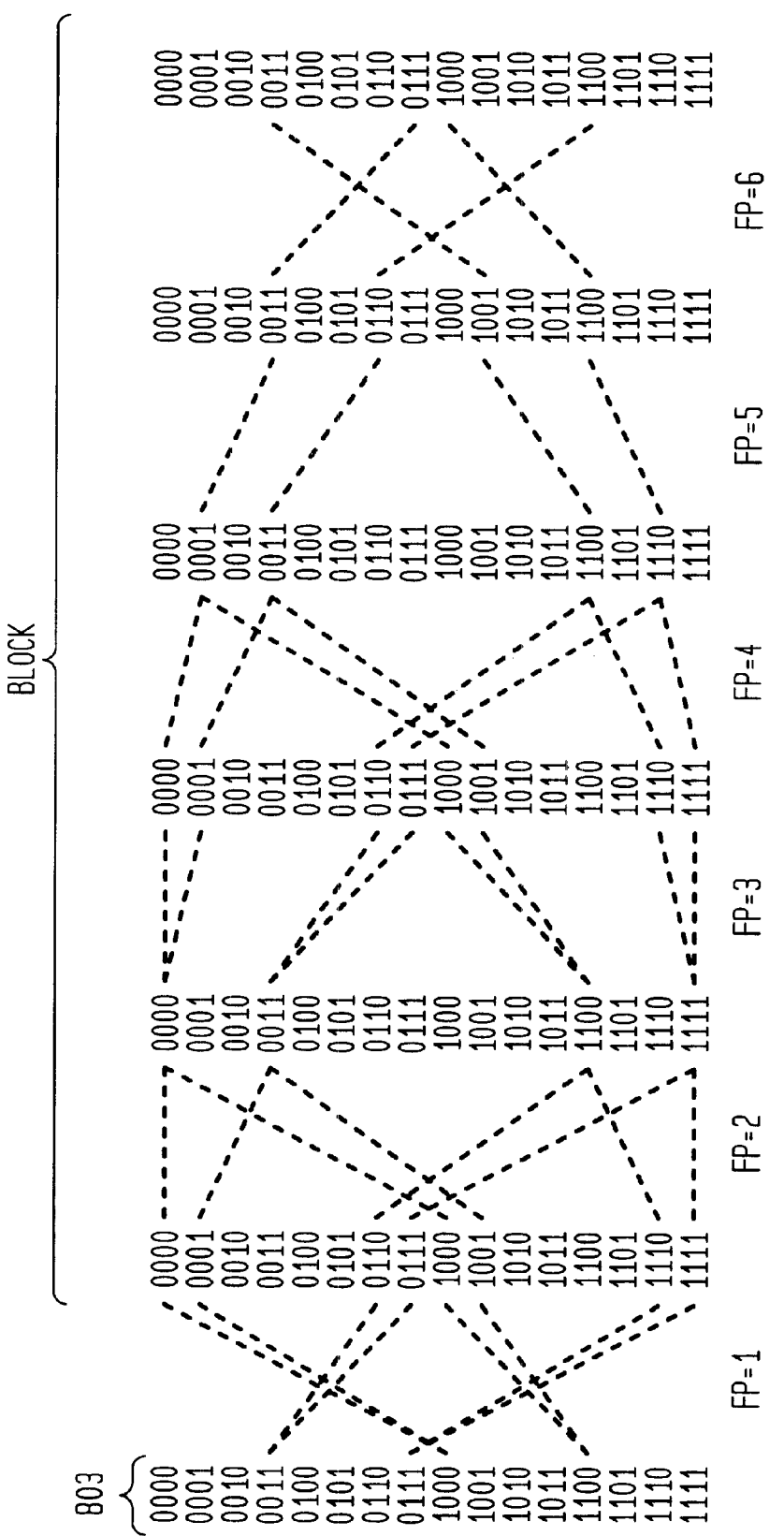
FIG. 8 shows remaining valid transitions between states of the trellis of FIG. 7 that satisfy constraints of the exemplary rate (2/6) code.

The rate (2/6) code maps from "00" to "000111", "11" to "111000", "01" to "110011", and "10" to "001100". The mapping constrains the sequence of symbol bits such that only certain groups of symbol bits appear. A constraint of the rate (2/6) code is, for example, that the last four symbol bits of a block adjacent to the first symbol of the next block may only be "0011", "1000", "0111", and "1100". Consequently, the transition from state #0 of column 703 (i.e., "0000") to any state of column 706 in the current trellis in FIG. 7 is an "illegal" transition because the last four symbol bits of a previous block cannot be "0000". Therefore, these branches from state "0000" in column 703 may be eliminated. This process may be repeated to identify all valid transitions based on the rate (M/N) code constraints. The constraints force the valid transitions upon the 16-state trellis for each of six forcing phases of the trellis (FP=1 to 6). FIG. 8 shows the valid transitions that satisfy constraints of the exemplary rate (2/6) code (16-state trellis). For example, the column 803 of the previous trellis only includes state #3 ("0011"), state #7 ("0111"), state #8 ("1000"), and state #12 ("1100"). The valid transitions (branches) in FIG. 8 are shown as dashed lines.

Figure 9:
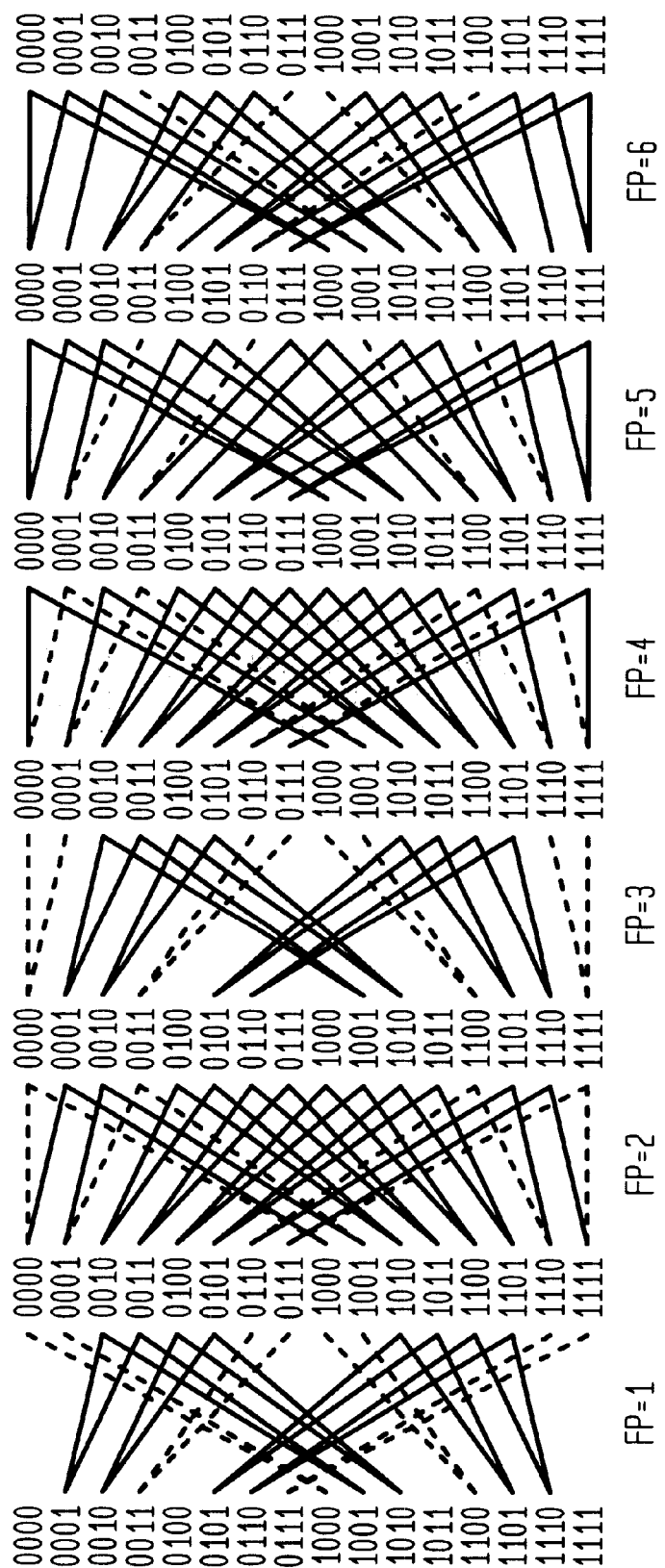
FIG. 9 shows a resulting trellis when the trellis of FIG. 7 is pruned based on the valid state transitions shown in FIG. 8

FIG. 9 shows pruning of the trellis given in FIG. 7 based on the valid transitions shown in FIG. 8. The following four steps generate the pruned trellis of FIG. 9 as follows. First, all possible transitions in a trellis phase of FIG. 7 are considered. Second, valid transitions of the corresponding trellis phase in FIG. 8 required by the code are identified with dashed lines. Third, identify each original transition of FIG. 7 (a branch indicated as a solid line) that arrives at a state in the next phase that is also reached as a transition indicated with a dashed line of FIG. 8. Fourth, delete the branches corresponding to the solid-line transition identified in the third step to give preference to the dashed lined transition desired by the code.

Figure 10:
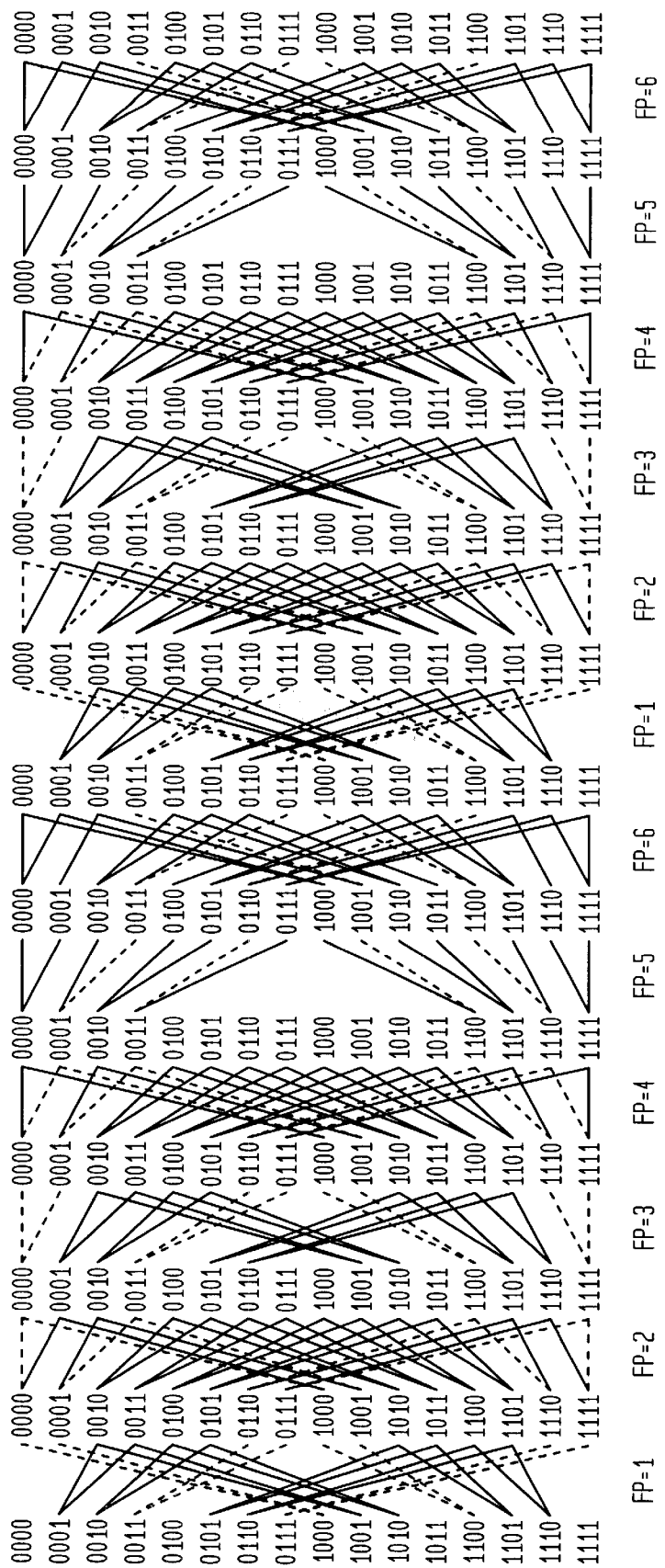
FIG. 10 shows a resulting trellis over 12 clock cycles when the trellis of FIG. 9 is pruned to remove illegal paths.

In FIG. 9, some states have no branches leave the state during some forcing phases and no pruning occurs during forcing phases FP=2 and FP=4. However, the trellis of FIG. 9 still allows "illegal" paths to propagate through the trellis (i.e., a path may be followed through the trellis consisting of only solid lines). To block illegal states, the trellis of FIG. 9 is pruned further. FIG. 10 shows the result of such pruning of FIG. 9, and FIG. 10 also shows the pruned (valid) state transitions over 12 clock cycles (two blocks of symbol bits). The trellis of FIG. 10 illustrates that illegal paths may be blocked: tracing a path through the trellis comprising only solid lines eventually leads to an end state which is eliminated in one of the forcing phases (no branches leave the end state).

For FIG. 10, the additional pruning of the trellis of FIG. 9 occurs during FP=5, where branches leaving state #4 through state #11 are deleted. The trellises of FIG. 8 and FIG. 9 are specified by the code, but the trellis of FIG. 10 is not necessarily unique. Alternative embodiments including different pruning (in addition to the pruning of the code constraints) may equivalently stop illegal paths. However, among these alternative embodiments, some trellises may be preferred based on detector performance, given limitations in fixed-point computation of particular implementations and finite decision delay in the path memory of, for example, the forced PRML detector 504 (FIG. 5).

The preference for selecting one branch over another branch is forced by, for example, the forcing signal FS applied to forced PRML detector 504 of FIG. 5. The forcing signal has a component $FS_i$ for each state of a trellis phase, and each state of a trellis phase has a corresponding add-compare-select (ACS) operation performed by an ACS circuit. For example, a 16-state trellis may require 16 ACS circuits. Each component $FS_i$ is generated by peripheral forcing phase digital control circuitry, such as the forcing logic 506 of FIG. 5. The forcing signal component $FS_i$ for the ith state is applied to the ACS circuit corresponding to state i. Forcing signal component $FS_i$ selects one of the two incoming branches to a state during the select portion of the ACS operation. An exemplary embodiment of an ACS circuit in accordance with the present invention as may be employed in the forced PRML detector 504 of FIG. 5 is shown in FIG. 11.

Figure 11:
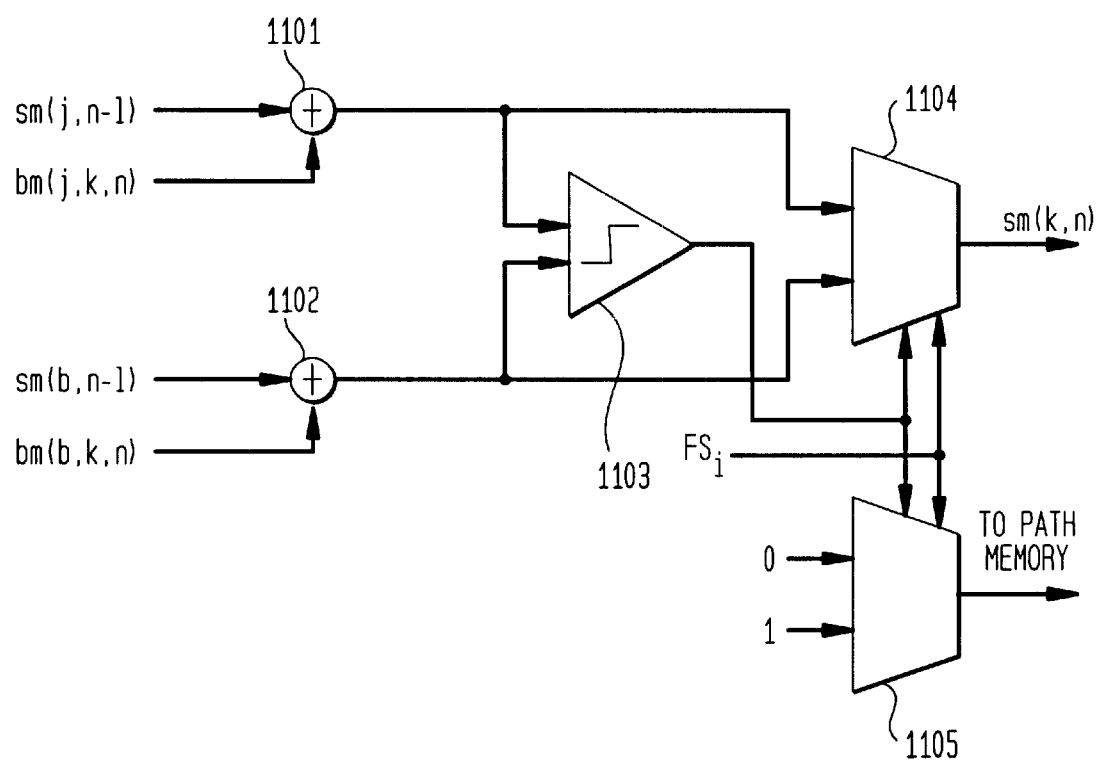
FIG. 11 shows an exemplary embodiment of an ACS circuit for the forced PRML detector of FIG. 5 implementing a pruned trellis in accordance with the present invention.

FIG. 11 shows adders 1101 and 1102 each provide a sum of the state metric and branch metric of time n−1 for a respective path (path sum). Comparator 1103 compares the path sums provided by adders 1101 and 1102 to provide an output signal indicating which path sum has a minimum value. The select operation of each of the MUXs 1104 and 1105 is now determined not only based on the output signal of comparator 1103, but also based on the forcing signal component $FS_i$ for the corresponding forcing phase of the pruned trellis. When the forcing signal component $FS_i$ indicates that no forcing is warranted, MUX 1104 selects as the state metric sm for the current clock cycle the path sum having the minimum value. When the forcing signal component $FS_i$ indicates that forcing is warranted, MUX 1104 selects as the state metric sm for the current clock cycle the path sum corresponding to the valid transition branch of the pruned trellis.

As described before, each branch corresponds to one decision d(n,k) for a symbol bit, and also corresponds to an ideal output channel sample yi[n]. At time n, the ideal output channel sample is yi(j,k,n) or yi(b,k,n). The branch metrics are calculated as given in equation (1), i.e., $bm(j,k,n)=(yr[n]-yi[j,k,n])^2$ and $bm(b,k,n)=(yr[n]-yi[b,k,n])^2$ where yr[n] is the received output channel sample at time n. MUX 1105, also based on the output signal of the comparator 1103 and the forcing signal component $FS_i$, selects either a "0" or "1" as a tentative decision made for the current symbol d(n,k). MUX 1105 selects the desired symbol on the select signal since a particular path (state transition) always corresponds to either a "0" or a "1" decision. Therefore, for each state transition, the minimum state metric for the current clock cycle is selected and a tentative decision for the current data bit d(n,k) is provided to a path memory for storage and shifting.

The operation of a forcing signal for each of the forcing phases (FPs) embodied in the pruned trellis of FIG. 10 may be described as follows FOR FP=1 to 6:
If FP=1
    Force state #0 to come from state #8
    Force state #1 to come from state #8
    Force state #6 to come from state #3
    Force state #7 to come from state #3
    Force state #8 to come from state #12
    Force state #9 to come from state #12
    Force state #14 to come from state #7
    Force state #15 to come from state #7
If FP=2
    No forcing
If FP=3
    Force state #0 to come from state #0
    Force state #1 to come from state #0
    Force state #6 to come from state #3
    Force state #7 to come from state #3
    Force state #8 to come from state #12
    Force state #9 to come from state #12
    Force state #14 to come from state #15
    Force state #15 to come from state #15
If FP=4
    No forcing
If FP=5
    Force state #0 to come from state #0
    Force state #1 to come from state #0
    Force state #2 to come from state #1
    Force state #3 to come from state #1
    Force state #4 to come from state #2
    Force state #5 to come from state #2
    Force state #6 to come from state #3
    Force state #7 to come from state #3
    Force state #8 to come from state #12
    Force state #9 to come from state #12
    Force state #10 to come from state #13
    Force state #11 to come from state #13
    Force state #12 to come from state #14
    Force state #13 to come from state #14
    Force state #14 to come from state #15
    Force state #15 to come from state #15
If FP=6
    Force state #3 to come from state #9
    Force state #7 to come from state #3
    Force state #8 to come from state #12
    Force state #12 to come from state #6

The forced PRML detector 504 preferably synchronizes the states of the trellis of the VA to the block encoding process. Consequently, the relationship between 1) block boundaries of the encoded servo data and 2) the forcing phase sequence is determined before the sequence detection begins. The forced PRML detector 504 is forced once synchronization occurs. Synchronization may employ a small number of pad bits inserted after the preamble of the servo data, allowing for detection of the end of the preamble. The preamble may not necessarily be encoded with the rate (M/N) code, but a pad bit may be added represented by a rate (M/N) code symbol. The end of the preamble may be detected by filtering a copy of the received channel output samples and applying the filtered channel output samples to a threshold detector. Pad bits for the rate (2/6) and rate (2/8) codes are preferably inserted between the preamble and SAM.

Figure 12:
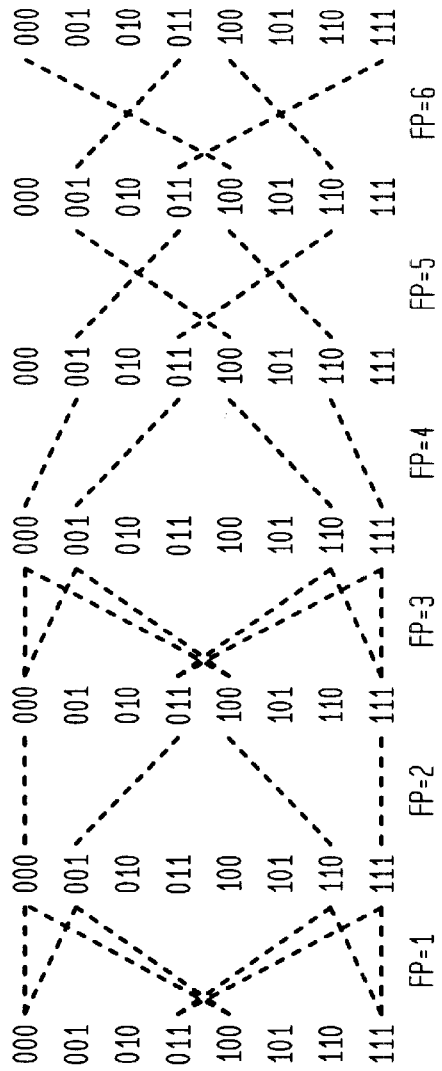
FIG. 12 shows the valid transitions between states in an 8-state trellis that satisfy constraints of the exemplary rate (2/6) code for a channel having a memory length of three.
Figure 13:
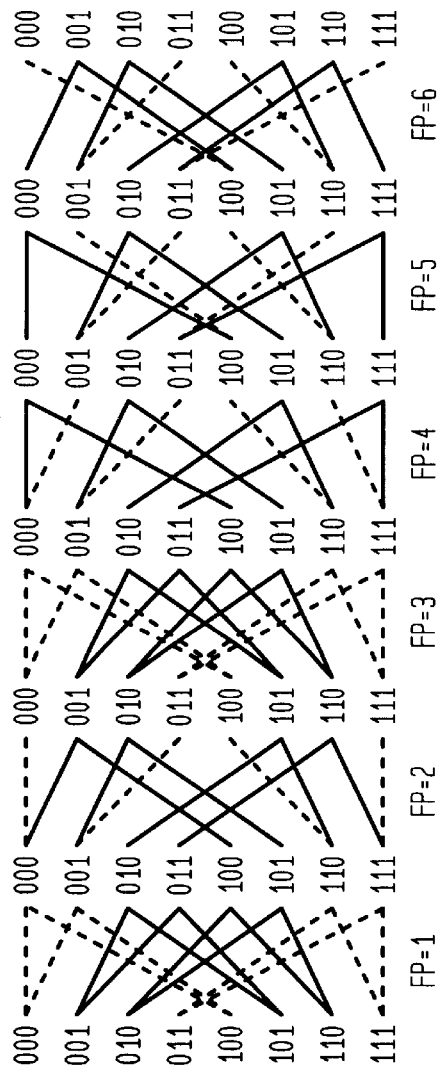
FIG. 13 shows a pruned trellis that accounts for the valid transitions shown in FIG. 12.
Figure 14:
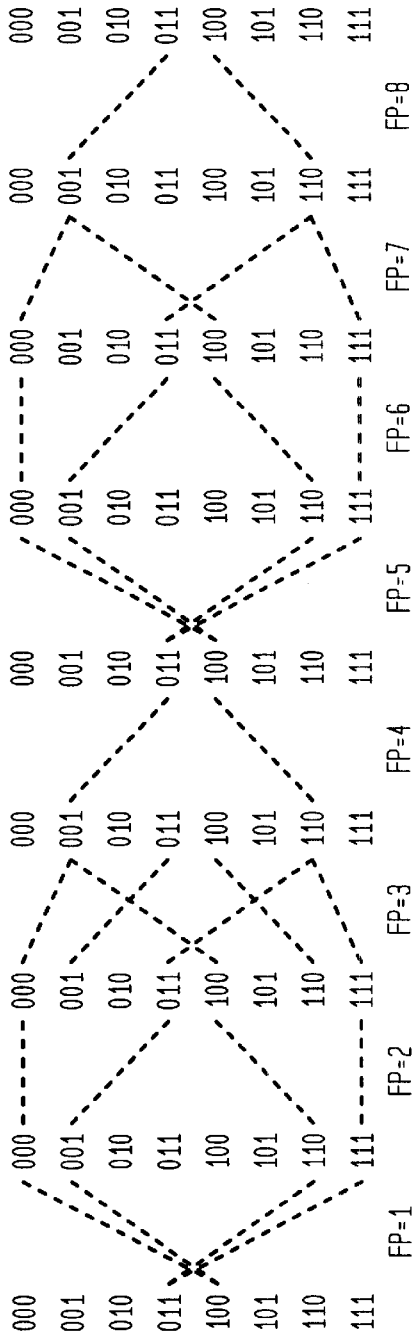
FIG. 14 shows the valid transitions between states in an 8-state trellis that satisfy constraints of the exemplary rate (2/8) code for a channel having a memory length of three.
Figure 15:
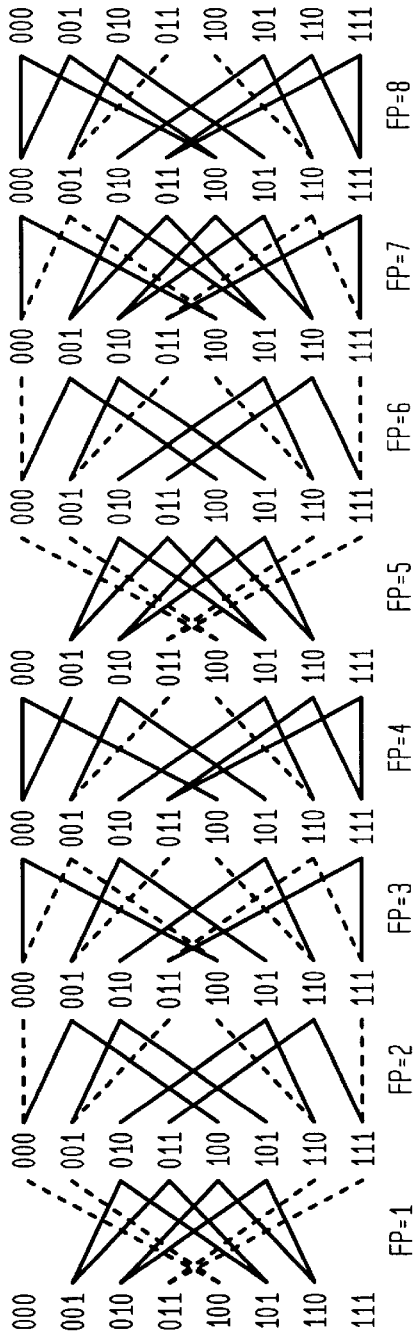
FIG. 15 shows a pruned trellis that accounts for the valid transitions shown in FIG. 14.
Figure 16:
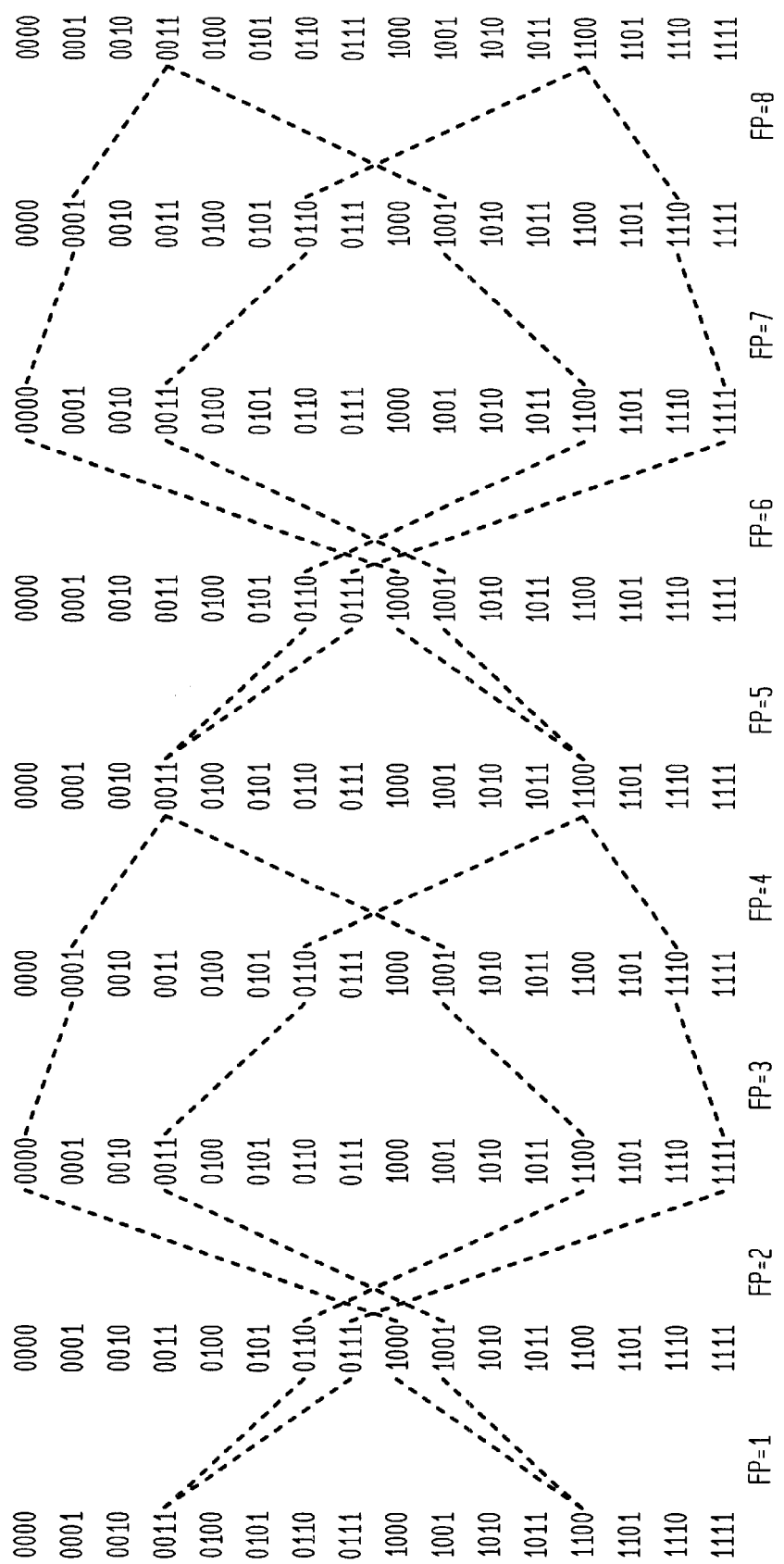
FIG. 16 shows the valid transitions between states in an 16-state trellis that satisfy constraints of the exemplary rate (2/8) code for a channel having a memory length of four.
Figure 17:
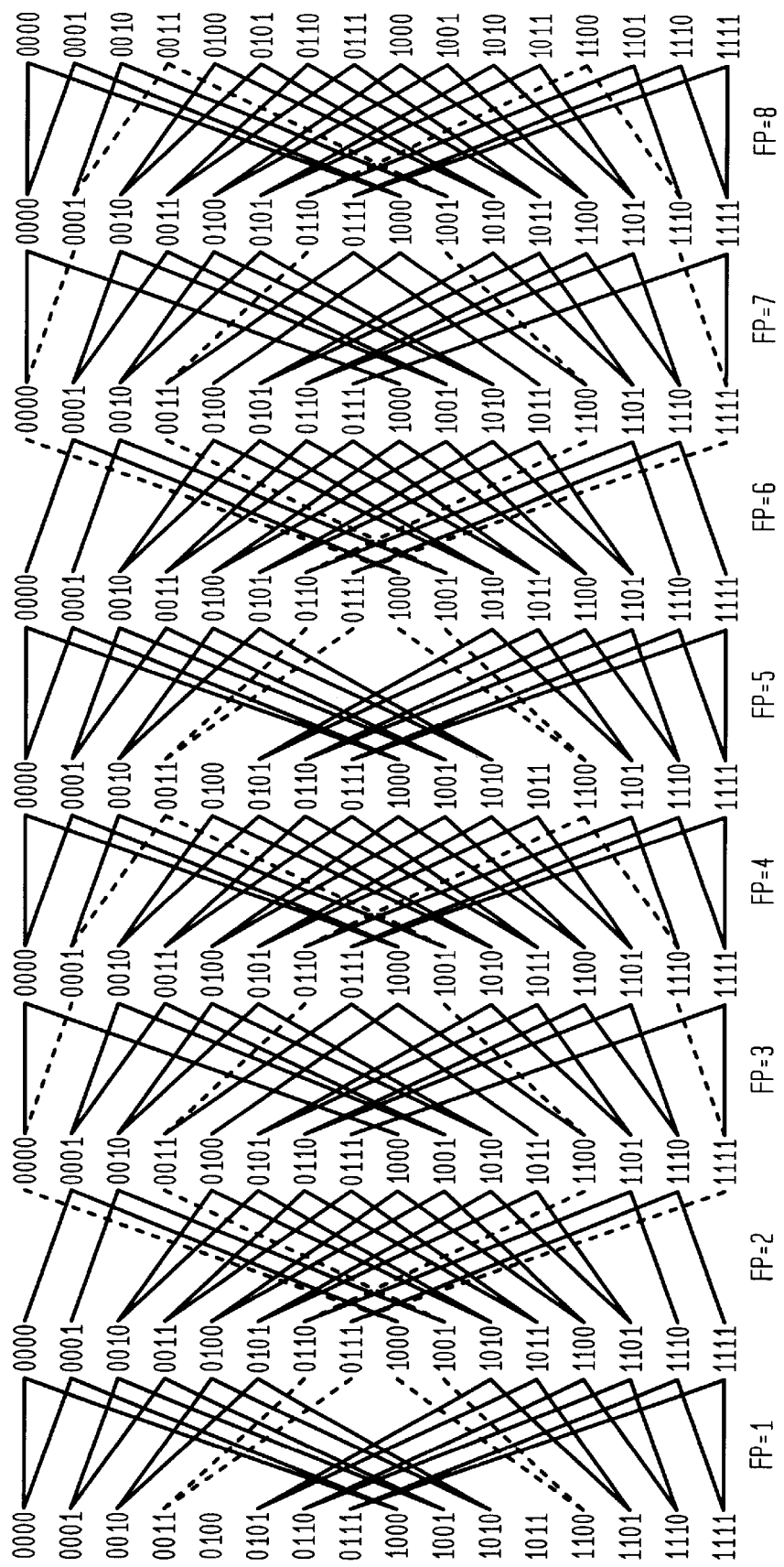
FIG. 17 shows a pruned trellis that accounts for the valid transitions shown in FIG. 16.

FIGS. 12 through 17 show pruned trellis transitions for the rate (2/6) code (8-state trellis) and rate (2/8) code (8-and 16-state trellises) of Table 1. FIG. 12 shows the valid transitions imposed by the rate (2/6) code (8-state trellis), and FIG. 13 shows the forced or pruned trellis taking into account the valid transitions of FIG. 12. FIG. 14 shows the valid transitions imposed by the rate (2/8) code (8-state trellis), and FIG. 15 shows the forced or pruned trellis taking into account the valid transitions of FIG. 14. FIG. 16 shows the valid transitions imposed by the rate (2/8) code (16-state trellis), and FIG. 17 shows the forced or pruned trellis taking into account the valid transitions of FIG. 16. For each of the rate (2/6) code (8-state trellis), rate (2/8) code (8-state trellis), and rate (2/8) code (16-state trellis), a final, pruned trellis may be generated as described above with regard to the rate (2/6) code, 16-state pruned trellis structure. The final, pruned trellis has illegal paths eliminated by selecting appropriate forcing phases that eliminate a large number of states through which paths with solid lines pass.

Coding Gain

The relative performance of different rate codes may be compared using a measure of the detection reliability bit-error rate. Such measure may be a ratio of 1) the minimum distance obtained in a system employing a particular rate code (dmc) and 2) the minimum distance obtained in a system employing no code (dmu). The quantity known in the art as the coding gain may be defined as 20 log (dmc/dmu) dB. The minimum distance may be the minimum Euclidean distance between two error events that may be falsely identified (i.e., the distance between the two error events that are the most likely to be confused with one another). Coding gain for a particular rate code employed to encode servo data is dependent upon the partial response of the channel. Table 2 summarizes exemplary coding gains of the rate (2/6) code and rate (2/8) code and the biphase code of the prior art. Table 2 also summarizes exemplary coding gains for a rate (3/8) code in accordance with the present invention. The rate (3/8) code may be formed based on the rate (2/8) code.

TABLE 2

| Code | Code Symbol bits | Rate | Coding Gain (dB) | |
| --- | --- | --- | --- | --- |
| | | | EPR4 channel | EEPR4 channel |
| Biphase | 1 = 1100; 0=0011 | 1/4 | 8.45 | 8.57 |
| 2/6 | 11=111000 | 1/3 | 6.99 | 7.32 |
| | 00=000111 | | | |
| | 10=001100 | | | |
| | 01=110011 | | | |
| 2/8 | 00=00110011 | 1/4 | 8.45 | 8.57 |
| | 11=11001100 | | | |
| | 01=00111100 | | | |
| | 10=11000011 | | | |
| 3/8 | 000=00110011 | 3/8 | 4.77 | 6.02 |
| | 111=11001100 | | | |
| | 001=00111100 | | | |
| | 110=11000011 | | | |
| | 010=11111111 | | | |
| | 101=00000000 | | | |
| | 100=11110000 | | | |
| | 011=00001111 | | | |

The calculated coding gains in Table 2 are for both the EPR4 magnetic recording channel (i.e., 8-state trellis for VA) and EEPR4 magnetic recording channel (i.e., 16-state trellis for VA).

While the exemplary embodiments of the present invention have been described with respect to methods for encoding and decoding, the present invention is not so limited. As would be apparent to one skilled in the art, various methods may be implemented as functions of circuit elements and may also be implemented in the digital domain as processing steps in a software program. Such software may be employed in, for example, a digital signal processor, microcontroller or general purpose computer.

The present invention can be embodied in the form of methods and apparatuses for practicing those methods. The present invention can also be embodied in the form of program code embodied in tangible medium, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of encoding a sequence of control data for storage on a medium, the control data to be used for subsequently reading information from the medium, comprising the steps of:

(a) mapping, with a complementary rate (M/N) code, a block of M data bits of the sequence of control data into a block of N symbol bits, M being an integer greater than 1 and N being an integer greater than M; and (b) storing the N symbol bits representing the control data on the medium, wherein, for step (a), the rate (M/N) code is either a rate 2/6, a rate 2/8, or a rate 3/8 code.

2. A method of generating a sequence of blocks of N symbol bits from a sequence of channel samples, the sequence of channel samples representing a sequence of control data and read from a medium, the method comprising the steps of:

(a) receiving successive portions of the sequence of channel samples as transitions between sequential states of a trellis, wherein:

the sequence of channel samples corresponds to the sequence of blocks of N symbol bits, each block of N symbol bits is formed from a block of M data bits of control data in accordance with a complementary rate (M/N) code, M being an integer greater than 1 and N being an integer greater than M;

(b) synchronizing a set of trellis phases and a set of forcing phases to the sequential states, the set of trellis phases corresponding to a block of N channel samples; and (c) determining, in accordance with a maximum-likelihood detection algorithm, a path thought states of the set of trellis phases, the path of states corresponding to a received block of N symbol bits, wherein:

for each trellis phase, a corresponding forcing phase provides, if necessary, a forced decision to the maximum-likelihood detection algorithm for a transition between states in the trellis, the forced decision based on a constraint of the rate (M/N) code.

3. The method as recited in claim 2, wherein, for step (a), the rate (M/N) code is either a rate 2/6, a rate 2/8, or a rate 3/8 code.

4. The method as recited in claim 2, further comprising the step e) mapping each block of N symbol bits into a block of M data bits to generate a sequence of control data, the control data to be used for subsequently reading additional information from the medium.

5. A method of decoding a sequence of symbol bits generated from information read from a medium, the control data to be used for subsequently reading information from the medium, comprising the steps of:

(a) receiving a sequence of blocks of N symbol bits detected from the medium, wherein each block of N symbol bits is formed by applying a complementary rate (M/N) code to a block of M data bits of control data, M being an integer greater than 1 and N being an integer greater than M;

(b) mapping each block of N symbol bits into a block of M data bits to generate the sequence of control data, wherein, for step (a), the rate (M/N) code is either a rate 2/6, a rate 2/8, or a rate 3/8 code.

6. An integrated circuit having an encoder that processes a sequence of control data for storage on a medium, the control data to be used for subsequently reading information from the medium, comprising:

a register for storing a block of M bits of the sequence of control data;

a logic circuit for mapping, with a complementary rate (M/N) code, the block of M data bits of the sequence of control data into a block of N symbol bits, M being an integer greater than 1 and N being an integer greater than M; wherein the N symbol bits representing the M data bits of the control data are stored on the medium, wherein the rate (M/N) code is either a rate 2/6, a 2/8, or a 3/8 code.

7. The invention as recited in claim 6, wherein the encoder is included in a magnetic recording system, the control data is servo data employed by a read head of the magnetic recording system to read information from the medium, and the encoder encodes the servo data for storage on the medium.

8. An integrated circuit having a detector circuit for generating a sequence of blocks of N symbol bits from a sequence of channel samples, the sequence of channel samples representing a sequence of control data and read from a medium, the detector circuit comprising:

a processor for implementing a trellis of a maximum-likelihood detection algorithm by receiving successive portions of the sequence of channel samples as transitions between sequential states of a trellis, the sequence of channel samples corresponding to the sequence of blocks of N symbol bits, each block of N symbol bits being formed from a block of M data bits of control data in accordance with a complementary rate (M/N) code, M being an integer greater than 1 and N being an integer greater than M; wherein the processor:

(1) synchronizes a set of trellis phases to the sequential states, the set of trellis phases corresponding to a block of N channel samples, and (2) determines, in accordance with the maximum-likelihood detection algorithm, a path through states of the set of trellis phases, the path of states corresponding to a received block of N symbol bits; and a forcing logic circuit for generating a set of forcing phases synchronized to the set of trellis phases and to the sequential states, wherein for each trellis phase, a corresponding forcing phase of the forcing logic circuit provides the processor, if necessary, a forced decision to the maximum-likelihood detection algorithm for a transition between states in the trellis, the forced decision based on a constraint of the rate (M/N) code.

9. The invention as recited in claim 8, further comprising a logic circuit that maps each block of N symbol bits into a block of M data bits to generate a sequence of control data, the control data used subsequently for reading additional information from the medium.

10. The invention as recited in claim 8, wherein the rate (M/N) code is either a rate 2/6, a 2/8, or a 3/8 code.

11. The invention as recited in claim 8, wherein the detector circuit is included in a magnetic recording system, the control data is servo data employed by a read head of the magnetic recording system to read information from the medium, and the encoder encodes the servo data for storage on the medium.

12. The invention as recited in claim 8, wherein the detector circuit is employs a maximum-likelihood algorithm accounting for a partial response of a recording channel of a magnetic medium, the magnetic medium being the medium from which the sequence of channel samples is received.

13. An integrated circuit having a decoder for decoding a sequence of symbol bits generated from information read from a medium, the control data used subsequently for reading information from the medium, comprising:

a register for storing a sequence of blocks of N symbol bits detected from the medium; and a logic circuit for mapping each block of N symbol bits into a block of M data bits to generate the sequence of control data, wherein each block of N symbol bits is formed by applying a complementary rate (M/N) code to a block of M data bits of control data, M being an integer greater than 1 and N being an integer greater than M, wherein the rate (M/N) code is either a rate 2/6, a 2/8, or a 3/8 code.

14. A computer-readable medium having stored thereon a plurality of instructions, the plurality of instructions including instructions which, when executed by a processor, cause the processor to implement a method of generating a sequence of blocks of N symbol bits from a sequence of channel samples representing information and read from a medium, the method comprising the steps of:

(a) receiving successive portions of the sequence of channel samples as transitions between sequential states of a trellis, wherein:

the sequence of channel samples corresponds to the sequence of blocks of N symbol bits, each block of N symbol bits is formed from a block of M data bits of control data in accordance with a complementary rate (M/N) code, M being an integer greater than 1 and N being an integer greater than M;

(b) synchronizing a set of trellis phases and a set of forcing phases to the sequential states, the set of trellis phases corresponding to a block of N channel samples; and (c) determining, in accordance with a maximum-likelihood detection algorithm, a path through states of the set of trellis phases, the path of states corresponding to a received block of N symbol bits, wherein:

for each trellis phase, a corresponding forcing phase provides, if necessary, a forced decision to the maximum-likelihood detection algorithm for a transition between states in the trellis, the forced decision based on a constraint of the rate (M/N) code.

15. The computer-readable medium as recited in claim 14, further comprising the step e) mapping each block of N symbol bits into a block of M data bits to generate a sequence of control data, the control data to be used for subsequently reading additional information from the medium.

16. A detector circuit for generating a sequence of blocks of N symbol bits from a sequence of channel samples, the sequence of channel samples representing a sequence of control data and read from a medium, the detector circuit comprising:

a processor for implementing a trellis of a maximum-likelihood detection algorithm by receiving successive portions of the sequence of channel samples as transitions between sequential states of a trellis, the sequence of channel samples corresponding to the sequence of blocks of N symbol bits, each block of N symbol bits being formed from a block of M data bits of control data in accordance with a complementary rate (M/N) code, M being an integer greater than 1 and N being an integer greater than M; wherein the processor:

(1) synchronizes a set of trellis phases to the sequential states, the set of trellis phases corresponding to a block of N channel samples, and (2) determines, in accordance with the maximum-likelihood detection algorithm, a path through states of the set of trellis phases, the path of states corresponding to a received block of N symbol bits; and a forcing logic circuit for generating a set of forcing phases synchronized to the set of trellis phases and to the sequential states, wherein:

for each trellis phase, a corresponding forcing phase of the forcing logic circuit provides the processor, if necessary, a forced decision to the maximum-likelihood detection algorithm for a transition between states in the trellis, the forced decision based on a constraint of the rate (M/N) code.

17. The invention as recited in claim 16, further comprising mapping means for mapping each block of N symbol bits into a block of M data bits to generate a sequence of control data, the control data to be used for subsequently reading additional information from the medium.

* * * * *